United States Patent [19]

Saarnimo

[11] Patent Number: 5,214,309
[45] Date of Patent: May 25, 1993

[54] THERMALLY CONDUCTIVE BAR COOLING ARRANGEMENT FOR A TRANSISTOR

[75] Inventor: Timo Saarnimo, Salo, Finland

[73] Assignee: Nokia Mobile Phones Ltd., Salo, Finland

[21] Appl. No.: 473,920

[22] Filed: Jan. 31, 1990

[30] Foreign Application Priority Data

Feb. 17, 1989 [FI] Finland .................. 890791

[51] Int. Cl.[5] ............. H01L 23/02; H02B 1/00; H05K 7/20; H01P 3/08
[52] U.S. Cl. ..................... 257/712; 257/713; 257/718; 257/719; 333/246; 333/247; 361/380; 361/381; 361/386; 361/389
[58] Field of Search ............ 357/80, 81, 74, 68, 357/65, 67; 361/380, 381, 382, 383, 384, 385, 386, 387, 388, 389; 333/246, 247

[56] References Cited

U.S. PATENT DOCUMENTS

| | | |
|---|---|---|
| 3,192,307 | 6/1965 | Lazar .................. 357/81 |
| 3,479,570 | 11/1969 | Gilbert ................. 357/74 |
| 3,517,272 | 6/1970 | Lee et al. ............. 357/74 |
| 3,962,719 | 6/1976 | Pfaff .................... 357/74 |
| 3,982,271 | 9/1976 | Olivieri et al. ...... 357/81 |
| 4,030,001 | 6/1977 | Medley, Jr. et al. ... 357/68 |
| 4,720,742 | 1/1988 | Egawa et al. ......... 357/81 |
| 4,950,427 | 8/1990 | Endo .................... 357/81 |
| 5,012,322 | 4/1991 | Guillotte et al. ..... 357/81 |

FOREIGN PATENT DOCUMENTS

| | | |
|---|---|---|
| 2801875A1 | 7/1979 | Fed. Rep. of Germany . |
| 2584533-A1 | 1/1987 | France . |
| 56-105668 | 11/1981 | Japan . |
| 63-104360 | 9/1988 | Japan . |

OTHER PUBLICATIONS

European Search Report, Application No. EP 90 10 2984.

Primary Examiner—Andrew J. James
Assistant Examiner—Carl Whitehead, Jr.
Attorney, Agent, or Firm—Darby & Darby

[57] ABSTRACT

A cooling structure for a high frequency power transistor is mounted on a circuit board where heat generated by the transistor is conducted from the semiconductor material through the collector conductor. A metal piece, which is larger than the collector conductor and sized to the requirements of heat removal through the collector conductor, contacts the collector conductor or an extension. The metal piece is solidly attached to a conductor strip formed on the circuit board. Heat is dissipated from the exposed surface of the metal piece to the ambient air and by conduction to the circuit board.

1 Claim, 1 Drawing Sheet

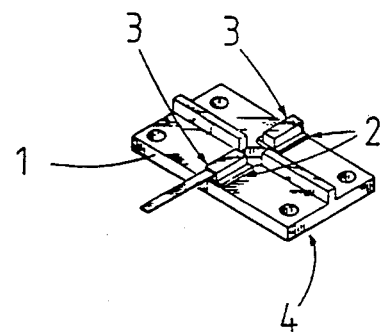
Fig. 1
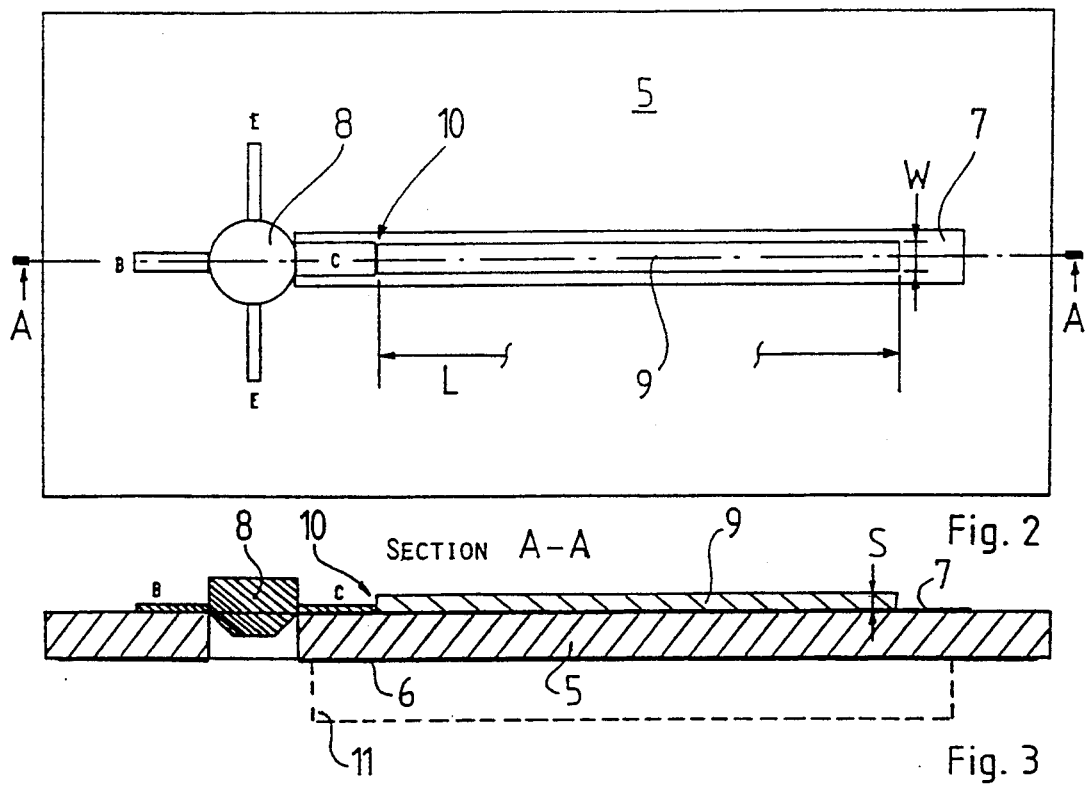
Fig. 2
Fig. 3

THERMALLY CONDUCTIVE BAR COOLING ARRANGEMENT FOR A TRANSISTOR

BACKGROUND OF THE INVENTION

The present invention relates to a cooling high frequency power transistor, in which the heat of the power loss is at least partially conducted from a semiconductor material through a collector conductor.

High frequency power transistors that turn power loss into heat which is brought out through a collector conductor, include plastic box transistors. The power loss of these transistors is typically a few watts at the most. Ordinarily these transistors have collector, emitter and base conductors that radially extend from the box, which conductors are attached onto the surface of, e.g., a circuit board and not into the holes in the circuit board as electrical components are traditionally attached. The constructions of even higher power transistors and low frequency transistors are completely different from these high frequency power transistors.

One known solution to the cooling problem of a transistor of this kind involves placing the transistor into a metal socket formed for it, to which socket ceramic pieces are attached. The pieces insulate electrically but conduct heat in order to insulate the base and the collector of the transistor from ground potential and to conduct heat from the collector to the socket and then to dissipate the heat from the socket. The state of the art is illustrated in FIG. 1 where reference number 1 indicates the socket arrangement as a whole, and reference number 2 indicates the ceramic pieces made, e.g., of aluminum oxide or beryllium oxide, for electrical insulation and conduction of heat. Reference number 3 indicates copper elements for the attachment of the collector and the base of the transistor, and the attachment of an adjustment circuit to the collector. This metal socket 1 is then attached with its face 4, facing downward and away from the transistor, to a circuit board to which also a separate adjustment circuit of the high frequency power transistor is attached. The socket 1 takes this form both in order to dissipate the power loss directly from the surface of the socket to the surrounding environment to conduct heat, from its area, which is considerably larger than the collector of the transistor, to the circuit board which in turn conducts it to a wider area, e.g., to the ground area. Thus the heat is dissipated through the entire circuit board.

Another method of cooling a plastic box transistor of this kind involves using a ceramic material circuit board, instead of a plastic material board, which is usually made of glass fibre epoxy. Such a ceramic circuit board made of a substrate material that conducts heat considerably better than glass fiber apoxy, e.g., aluminum oxide.

The cooling methods presented above are efficient enough, but the one mentioned first is both complicated and difficult to construct. It is thus also an expensive solution. There are also problems connected with the latter method, including the lack of flexibly and reliably in coupling of the ceramic material to the larger surrounding circuit board and/or box. Even this solution is thus relatively expensive and difficult.

SUMMARY OF THE INVENTION

The object of the present invention is to create a cooling construction for a transistor that has been described above, which cooling structure is both efficient and simple when considering the number of parts and their design, and thus inexpensive. The object of the invention is also to create a cooling construction, in which no expensive or rare materials are need as electric insulating materials. Yet another object of the invention is to create a cooling construction which is simple to produce and which requires neither separate phases nor additional structural parts for the assembly of the circuit board.

The defects mentioned above are improved considerably by a cooling construction in accordance with the present invention and the defined goals are reached. In order to carry this out, the solution in accordance with the present invention is characterized by contacting the transistor's collector conductor to a metal piece. This metal piece is larger than the collector conductor and is attached to a conductive adjustment strip of an adjustment circuit. The heat is conducted through the metal piece and dissipated into the surrounding air or to the circuit board.

The most important advantage of the invention is that the cooling of the plastic box type of transistor that has been described is made effective by a very simple arrangement, which requires neither expensive additional structural parts nor additional phases of work in the assembly of the circuit board.

BRIEF DESCRIPTION OF THE DRAWINGS

The invention is described in more detail in the following description of preferred embodiment with reference to the enclosed figures, wherein:

FIG. 1 illustrates a cooling solution in accordance with the prior art;

FIG. 2 illustrates a cooling solution in accordance with the invention when examined from the coupling side of the transistor towards the surface of the circuit board; and FIG. 3 is the profile of the cooling solution in the FIG. 2.

DESCRIPTION OF THE PREFERRED EMBODIMENTS

The solution in accordance with the prior art, illustrated in FIG. 1, has already been described above.

FIGS. 2 and 3 illustrate a circuit board 5, on one face of ground 6 which there is a ground 6 at ground potential, which ground is formed of a copper coating. On the other face adjustment of board 5 there is a conductive strip 7 of an adjustment circuit (not shown), also formed of the copper coating on the circuit board. The figures also illustrate the high frequency power transistor 8, which is of that type where the power loss or heat is brought out through the collector conductor. High frequency here means frequencies on the order of radio frequencies and the like. The collector conductor of the transistor 8 is marked with the letter C, the base with B, and the emitters with the letter E. These connectors are attached by surface mounting them to the coating of the circuit board on the same side as the adjustment strip 7. This is not, however, an actual surface mounting component. The circuit board 5 can be of a traditional epoxy glass fibre type with usual metal coatings 6, 7 on both sides. The transistor is coupled to its adjustment circuit, which is quite usual in itself, through adjustment strip 7 attached to the collector C conductor of the transistor 8, which adjustment circuit in this case can be placed directly on the circuit board 5 using traditional circuit board techniques.

According to the invention the area of the adjustment strip 7 is considerably larger than that of a traditional adjustment strip. Also, contacting the top of the adjustment strip is a rather thick piece of good heat conducting material 9 usually made of metal, e.g., of copper. Typically the cross section of the piece 9, which is formed of dimensions W and S, is slightly larger than the cross section of the collector conductor C of the transistor 8 and it is very long compared with the measurement or the cross section of the transistor or its structural parts. Typically the length of the piece 9 is 10–20 times its width.

The piece 9 functions as follows. The heat coming from the collector conductor C of the transistor is transferred to the piece 9, which is in contact with it at the point 10, both through longitudinal contact and through the conductive coating of strip. Since the piece 9 is a good heat conductor, it distributes the conducted heat over the large area determined by its length and width. From here the heat is both dissipated directly from the surface of the piece 9 to the surrounding air and is also conducted to the circuit board 5 and through it to the ground side 6. From here the heat can be dissipated to the surrounding air either directly from the face 6 or from a separate cooling element 11 placed against the face 6, which cooling element is illustrated in the figures only schematically using a broken line. The efficiency of the invention is thus based on the fact that the amount of heat that has been conducted to the circuit board is directly proportional to the cross section, through which the heat is conducted, which cross section in this case is the area of the piece 9 determined by the length L and the width W. Also the length L, the width W, and the thickness S of the piece or some other similar external area of the piece influences the amount of heat dissipated directly from the surface of the piece.

Using the method described above, e.g. a complicated socket or separate adjustment circuits attached to it as shown in FIG. 1, are not needed. When applying the solution of the present invention, both the cooling piece 9 and the adjustment circuit can be directly and simply located on the circuit board 5, through the adjustment slip of the adjustment circuit. The piece 9 can simply be a piece of a copper conductor of suitable thickness, which copper conductor is attached to the circuit board by soldering, welding or by some other similar means, as all the other components, and at the same time in the assembly. The metal piece 9 can also be permanently attached, e.g. by spot welding or soldering to the collector conductor C of the transistor, before installing the transistor to the circuit board.

According to one embodiment of the invention the collector conductor C of the high frequency power transistor is formed large enough to function as a cooling piece 9 by itself. In that case the length and the width of the collector conductor are equal to the dimensions L and W of the piece 9.

The invention is not restricted to the form of a conductor strip of the adjustment circuit and/or the form of the piece 9 shown in the figures, and its dimensions L, W and S can vary in accordance with the requirements for the cooling power and the use of space. The piece 9 does not have to be linear, it can be bent to form an arc or a curve or to some other suitable form. Exact values cannot be given for the dimensions of the piece 9, rather they depend on the detailed structure of the transistor, the power loss, the material of the piece and the material and the dimensions of the circuit board 5. The dimensioning has to be performed so that the piece 9 is large enough to keep the temperature of the semiconductor material of the transistor 8 low enough to avoid damage.

An alteration of the invention can also be considered that, e.g., utilizes a suitable, very small profile or a corresponding piece is used as piece 9, in order to improve the direct convention of heat. The piece 9 can also be made of some material other than copper, e.g., aluminum, but then the coupling technique to the adjustment strip has to be of a different type.

I claim:

1. A heat dissipation system for a transistor, said transistor being suited for mounting on a printed circuit board, said transistor having external conductors for its base, collector and emitter, respectively, comprising:

a printed circuit board, said board having a first surface and a second surface, and being a poor heat conductor;

a first conductive coating formed on said first surface of said circuit board for contacting at least said collector conductor when said transistor is mounted on said board;

a thermally conductive bar having external surfaces substantially exposed to the ambient, said bar being fixed to said first conductive coating and contacting said collector conductor of said transistor when said transistor is mounted on said circuit board, said bar having a length greater than its width, said length extending away from a transistor when a transistor is mounted to said circuit board, said length being in a range of 10 to 20 times the width, a portion of the heat generated by said transistor being dissipated by said bar when said transistor is mounted to said circuit board and operating, said bar dissipating heat at least directly to the ambient from said external surfaces and through said first conductive coating to said circuit board.

* * * * *